US011069540B2

(12) United States Patent
Chou

(10) Patent No.: US 11,069,540 B2
(45) Date of Patent: Jul. 20, 2021

(54) PACKAGE ON PACKAGE AND A METHOD OF FABRICATING THE SAME

(71) Applicant: PHOENIX PIONEER TECHNOLOGY CO., LTD., Hukou Township (TW)

(72) Inventor: Pao-Hung Chou, Hukou Township (TW)

(73) Assignee: PHOENIX PIONEER TECHNOLOGY CO., LTD., Hukou Township, Hsinchu County (TW)

( * ) Notice: Subject to any disclaimer, the term of this patent is extended or adjusted under 35 U.S.C. 154(b) by 281 days.

(21) Appl. No.: 14/547,717

(22) Filed: Nov. 19, 2014

(65) Prior Publication Data

US 2016/0037635 A1    Feb. 4, 2016

(30) Foreign Application Priority Data

Jul. 31, 2014    (TW) .................. 103126157

(51) Int. Cl.
| | |
|---|---|
| *H01L 23/498* | (2006.01) |
| *H01L 21/48* | (2006.01) |
| *H05K 3/46* | (2006.01) |
| *H05K 3/40* | (2006.01) |

(52) U.S. Cl.
CPC .... *H01L 21/4857* (2013.01); *H01L 23/49811* (2013.01); *H05K 3/4007* (2013.01); *H05K 3/4682* (2013.01); *H01L 23/49822* (2013.01); *H01L 2224/16225* (2013.01); *H01L 2224/32225* (2013.01); *H01L 2224/48091* (2013.01); *H01L 2224/48227* (2013.01); *H01L 2224/73204* (2013.01); *H01L 2224/73265* (2013.01); *H01L 2924/15311* (2013.01); *H01L 2924/181* (2013.01); *H05K 2201/10378* (2013.01)

(58) Field of Classification Search
CPC ................. H01L 24/03; H01L 21/4857; H01L 23/49811; H01L 23/49822
See application file for complete search history.

(56) References Cited

U.S. PATENT DOCUMENTS

| | | | | |
|---|---|---|---|---|
| 5,436,411 | A * | 7/1995 | Pasch .................. | H01L 23/5384 174/250 |
| 7,022,399 | B2 * | 4/2006 | Ogawa ................ | H01L 21/4857 174/258 |
| 2002/0117743 | A1 * | 8/2002 | Nakatani ............. | H01L 21/4857 257/687 |

(Continued)

*Primary Examiner* — Zandra V Smith
*Assistant Examiner* — Abbigale A Boyle
(74) *Attorney, Agent, or Firm* — Steptoe & Johnson LLP

(57) ABSTRACT

A method for fabricating an interposer substrate is provided, including forming a wiring layer on a carrier, forming an insulating layer on the carrier, forming on the wiring layer a wiring build-up layer structure that is electrically connected to the wiring layer, forming on the wiring build-up layer structure external connection pillars that are electrically connected to the wiring build-up layer structure, and removing the carrier, with the wiring layer is exposed from a surface of the insulating layer. The fabrication process of the via can be bypassed in the fabrication process by forming coreless interposer substrate on the carrier, such that the overall cost of the fabrication process can be decreased, and the fabrication process is simple. This invention further provides the interposer substrate.

6 Claims, 6 Drawing Sheets

(56) References Cited

U.S. PATENT DOCUMENTS

2008/0079163 A1* 4/2008 Kurita ................ H01L 21/6835
  257/759
2012/0049322 A1* 3/2012 Su ..................... H01L 21/76898
  257/532
2013/0277841 A1* 10/2013 Lii ..................... H01L 23/5283
  257/741

* cited by examiner

PACKAGE ON PACKAGE AND A METHOD OF FABRICATING THE SAME

BACKGROUND OF THE INVENTION

1. Field of the Invention

This invention relates to interposer substrates, and, more particularly, to an interposer substrate for a package on package (PoP) and a method for fabricating the interposer substrate.

2. Description of Related Art

With the evolution of technology in the semiconductor package, a semiconductor device has been developed different types of packages. In order to enhance electrical function and to save packaging space, a plurality of package structures are stacked so as to form a package on package (PoP). This packaging method can accomplish the heterogeneous integration features of a system in package (SiP), such that electronic components with different functions, such as, memory, central processors, graphics processors, video processors and the like, are suitable for thin electronic products by stacking design so as to achieve the integration of the system.

In the early period, a package on package is formed from a memory packaging member (memory IC) by stacking a plurality of solder balls on a logic packaging member (logic IC). With the requirements of more compact and improve function of electronic products, the layout of the memory packaging member is more dense with nano units, such that the distance between contacts is smaller. However, the distance of the logic packaging member with micrometer units cannot be decreased to correspond to the distance of the memory packaging member, such that the memory packaging member with high circuit density has no suitable logic packaging member, and that electronic products cannot be effectively produced.

Therefore, in order to overcome the above problem, an interposer substrate 10 is disposed between a memory packaging member 11 and a logic packaging member 12. As illustrated in FIG. 1, the bottom end of the interposer substrate 10 is electrically connected with the logic packaging member 12 having a logic chip 120 with larger distance, and the upper end of the interposer substrate 10 is electrically connected with the memory packaging member 11 having a memory chip 110 with smaller distance.

However, in the prior package on package 1, a plurality of solder balls 13 are used as supporting and electrically connecting members. Further, as the number of contact of electronic products (i.e., I/O) are increasing, and the size of packaging member is constant, the distance between the solder balls 13 has to be decreased, such that bridging phenomenon is easily occurred during reflowing and thus short circuit is induced, and that it further results in extremely low product yield and poor reliability.

Therefore, it is developed that the solder ball 13 is replaced by a copper pillar replaces. The height of the copper pillars can remain consistency through the characteristic of the copper pillar not deforming during reflowing, such that the bridging problem can be avoided, and the product yield can be increased.

FIGS. 1A-1D are schematic sectional views of a method for fabricating an interposer substrate 10 according to the prior art.

As illustrated in FIG. 1A, a plate 10' such as a copper foil substrate is penetrated so as to form a plurality of vias 100.

As illustrated in FIG. 1B, wiring layers 15 are formed on two sides of the plate 10' through the copper foil 10a, and a plurality of conducting holes 16 are formed in the vias 100 and electrically connected to the wiring layers 15.

As illustrated in FIG. 1C, an insulating protection layer 17 is formed on the plate 10' and the wiring layer 15, with a portion of the wiring layer 15 exposed, for a conductive pad 150 to be disposed thereon.

As illustrated in FIG. 1D, a copper pillar 14 is formed on the conductive pad 150 in an electroplating way.

However, the method for fabricating the interposer substrate 10, since including the formation of the vias 100, is complicated and has a high cost. Besides, an additional conducting layer 140 has to be formed so as to make copper pillars 14 in an electroplating way on one side or two sides under requirements. Therefore, a little bit of conducting layer 140 may usually be remained when unnecessary conducting layer 140 is removed, such that the conductivity of the copper pillars 14 may be affected. For example, the rest of the conducting layer 140 may electrically connect adjacent copper pillars 14, and thus resulting in short circuit. In the consequence, the overall conductivity of the interposer substrate 10 may decrease.

Further, the thickness of the interposer substrate 10 may be limited under the consideration of the plate 10' (i.e., the core layer). For example, the interposer substrate is hard to be made thin. Accordingly, the interposer substrate not only is hard to be produced but also easily has problems of damages to the plate 10' when the thickness of the interposer substrate is thinner (below 130 um).

Further, the line width/line space (L/S) design of the wiring layer 15 is easily limited. In general, the smallest line width/line space of the fabricating process of a substrate is merely 12/12 um. However, when the L/S is below 25/25 um, the product yield is readily affected.

Therefore, how to overcome the various problems of the prior art has become the emergency issues that need to be resolved.

SUMMARY OF THE INVENTION

In view of the above defects of the prior art, this invention provides an interposer substrate, comprising: an insulating layer having a first surface and a second surface opposing the first surface; a wiring layer formed on the first surface of the insulating layer and being in communication with the second surface of the insulating layer; a wiring build-up layer structure formed on and electrically connected to the wiring layer; and a plurality of external connection pillars disposed on and electrically connected to the wiring build-up layer structure.

This invention further provides a method for fabricating an interposer substrate, comprising: forming a wiring layer on a carrier, forming on the carrier an insulating layer that has a first surface and a second surface opposing the first surface, wherein the insulating layer is attached to the carrier via the first surface thereof, and the wiring layer is exposed from the second surface of the insulating layer; forming on the wiring layer a wiring build-up layer structure that is electrically connected to the wiring layer; forming on the wiring build-up layer structure a plurality of external connection pillars that are electrically connected to the wiring build-up layer structure; and removing the carrier, such that the wiring layer is exposed from the first surface of the insulating layer.

In conclusion, in the interposer substrate and the method for fabricating the interposer substrate the coreless interposer substrate is formed on the carrier, such that in the process, the fabrication process of via may be eliminated.

Accordingly, the cost of the overall process in this embodiment is low and the process is simple.

Further, the interposer substrate without the limitation of the prior plate not only is readily produced but also has no problem of plate damages. In addition, circuits with more fine line width/line space (L/S) can be produced so as to increase the density of layout.

DETAILED DESCRIPTION OF THE INVENTION

The following is explanation of the disclosed embodiments by examples, and those who are familiar with this technical field can easily understand the advantages and efficacy by the explanation.

Notice that the illustrated structure, ratio and size of appended figures in the explanation are only used for the disclosed embodiments in the explanation for understanding and reading of those who are familiar with this technical field. It is not applicable for limiting implementing condition of the disclosed embodiments, so the illustration doesn't have actual meaning in the technical field. Any modification of structure, change of ratio and adjustment of size should fall in the disclosed embodiments when the efficacy and purpose of the disclosed embodiments are not affected. Meanwhile, the terms that are quoted in the explanation like "upper," "lower," "first," "second," "a" and so on only intent for convenience of description rather than limiting feasible scope of the disclosed embodiments. Change or adjustment of relative relationship under no actual alteration of content of technique should be seen as feasible scope of the disclosed embodiments.

FIGS. 2A-2F are schematic sectional views illustrating a method for fabricating a coreless interposer substrate 2 according to a first embodiment of the present invention.

Figure 1:
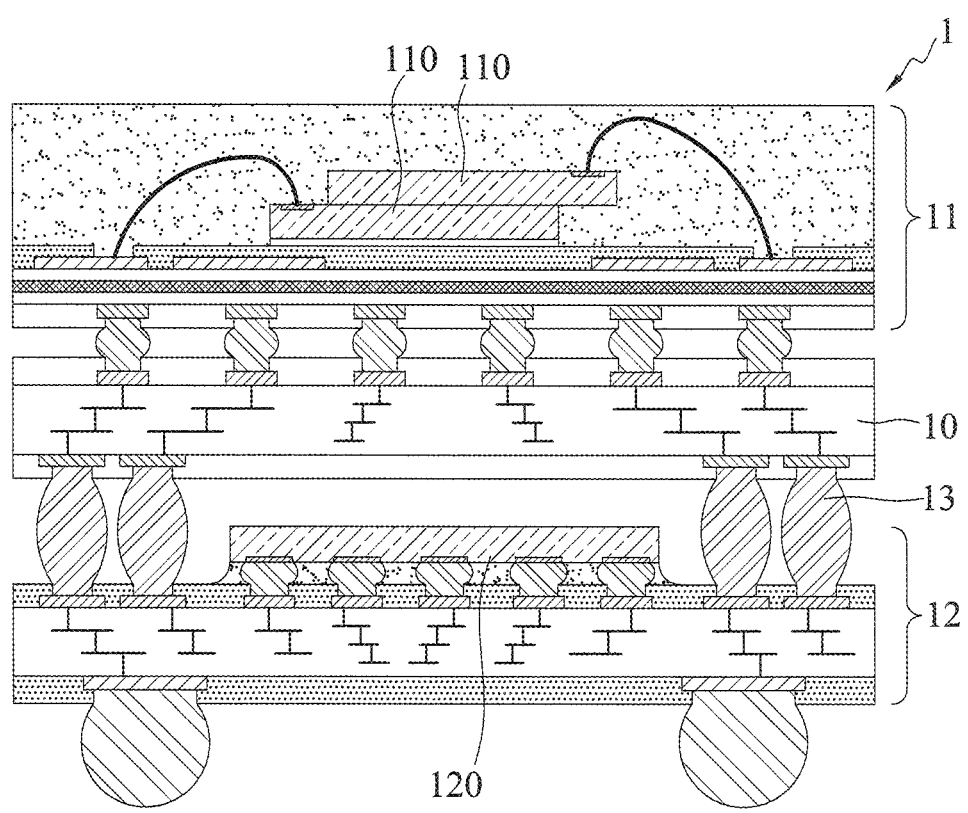
FIG. 1 is a schematic sectional view of a package on package (PoP) according to the prior art.
Figure 1A:
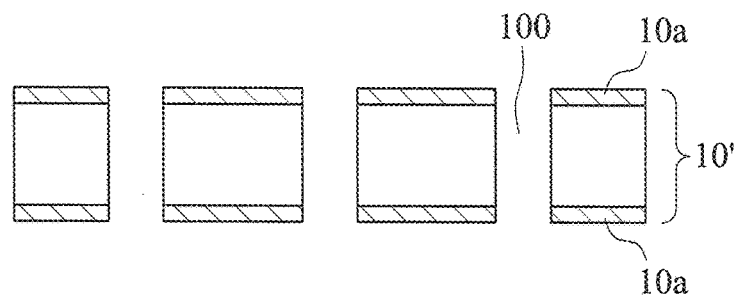
FIGS. 1A-1D are schematic sectional views illustrating a method for fabricating an interposer substrate according to the prior art.
Figure 1B:
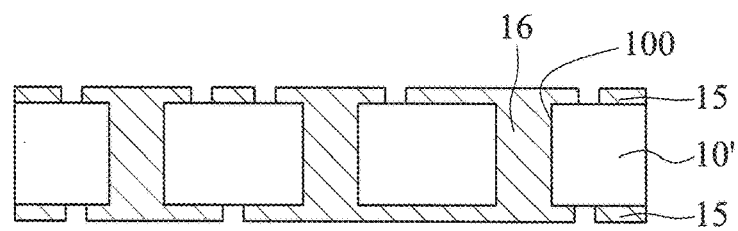
Figure 1C:
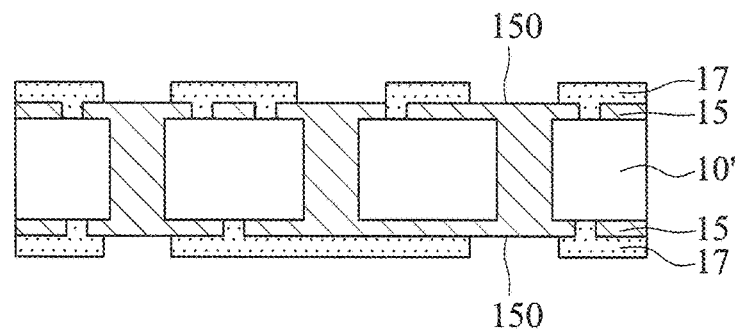
Figure 1D:
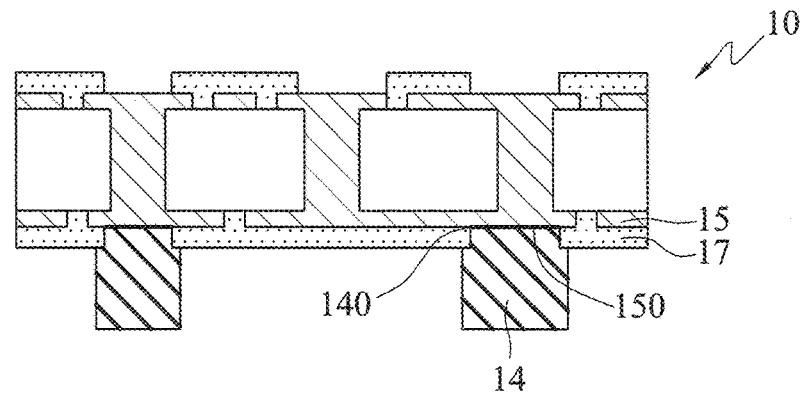
Figure 2A:
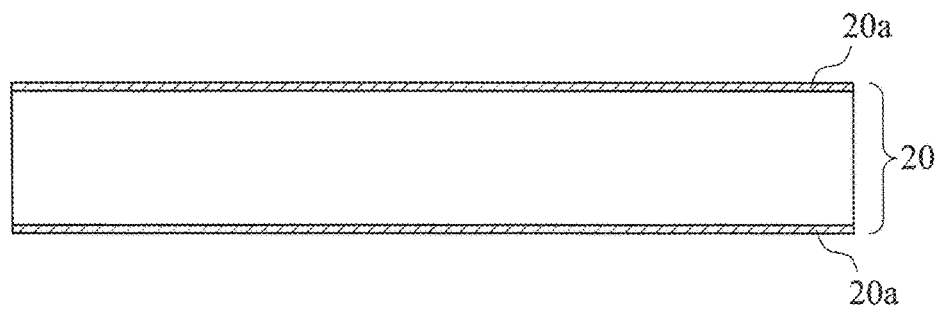
FIGS. 2A-2F are schematic sectional views illustrating a method for fabricating an interposer substrate according to a first embodiment of the present invention, wherein FIG. 2F' is another aspect of FIG. 2F.

As illustrated in FIG. 2A, a carrier 20 is provided. In an embodiment, the carrier 20 is a substrate, such as, but not limited to, a copper foil substrate, a silicon-containing plate or conductor of complete metal. In an embodiment, the copper foil with metal material 20a on two sides thereof is for explanation.

Figure 2B:
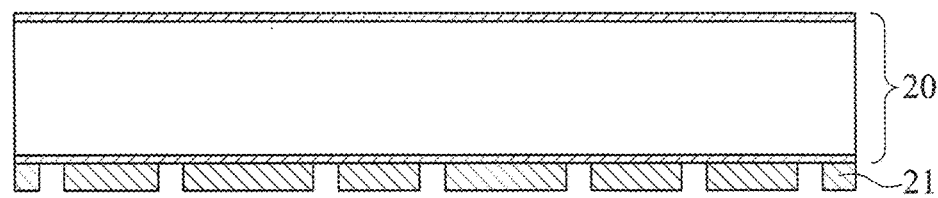

As illustrated in FIG. 2B, a wiring layer 21 is formed on the carrier 20 through a patterning process.

In an embodiment, the wiring layer 21 includes a plurality of conductive pads 210 without conducting traces 211.

Figure 2C:
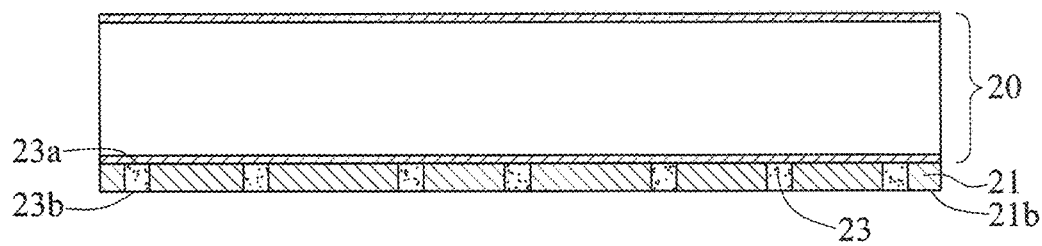

As illustrated in FIG. 2C, an insulating layer 23 is formed on the carrier 20. The insulating layer 23 has a first surface 23a and a second surface 23b opposing the first surface 23a. The insulating layer 23 is attached to the carrier 20 via the first surface 23a of the insulating layer 23. In an embodiment, the insulating layer 23 is formed on the carrier 20 by a molding process or a lamination process. The insulating layer 23 is made of a molding compound, a primer, or a dielectric material such as epoxy.

In an embodiment, a lower surface 21b of the wiring layer 21 is flush with the second surface 23b of the insulating layer 23.

Figure 2D:
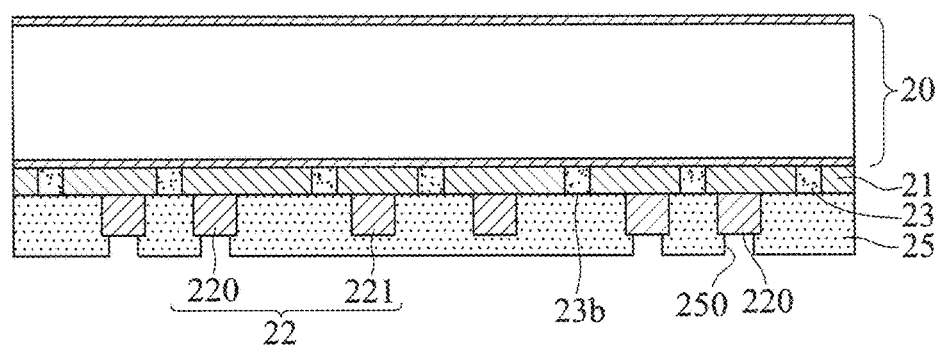

As illustrated in FIG. 2D, a wiring build-up layer structure 22 is formed on the wiring layer 21 and electrically connected to the wiring layer 21. Further, an insulating protection layer 25 such as a solder mask may be formed on the second surface 23b of the insulating layer 23, and the insulating protection layer 25 encapsulates the wiring build-up layer structure 22.

In an embodiment, the wiring build-up layer structure 22 comprises a plurality of conductive pads 220 and a plurality of conducting traces 221, and the insulating protection layer 25 has a plurality of openings 250, with the conductive pads 220 exposed from the openings 250.

Figure 2E:
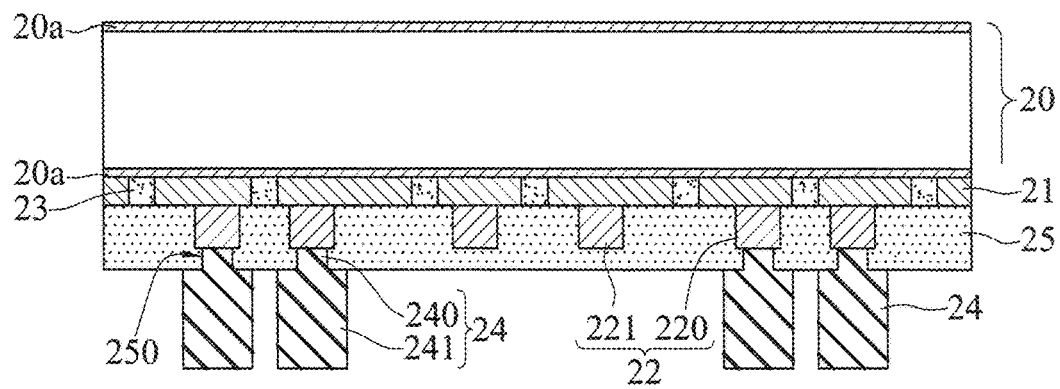

As illustrated in FIG. 2E, a plurality of external connection pillars 24 are disposed on and electrically connected to the conductive pads 220 by an electroplating way through a patterning process.

In an embodiment, each of the external connection pillars 24 comprises a connection portion 240 in the openings 250 and a main portion 241 formed on the insulating protection layer 25 and integrally made with the connection portion 240.

Figure 2F:
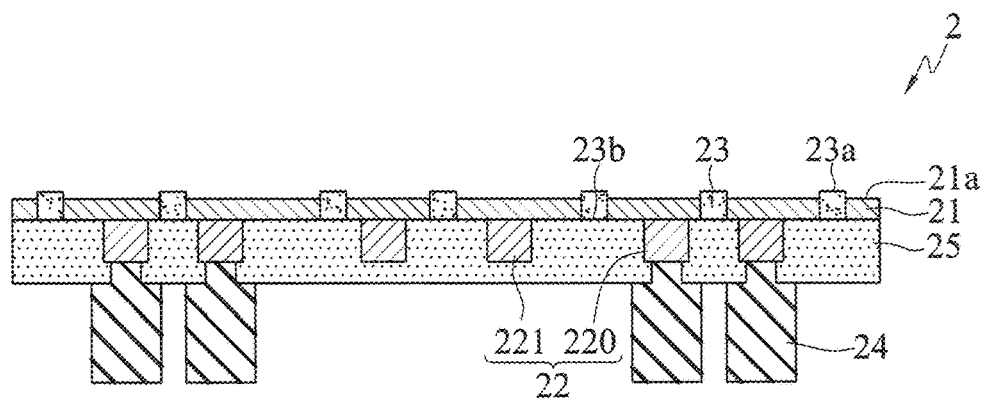
Figure 2F:
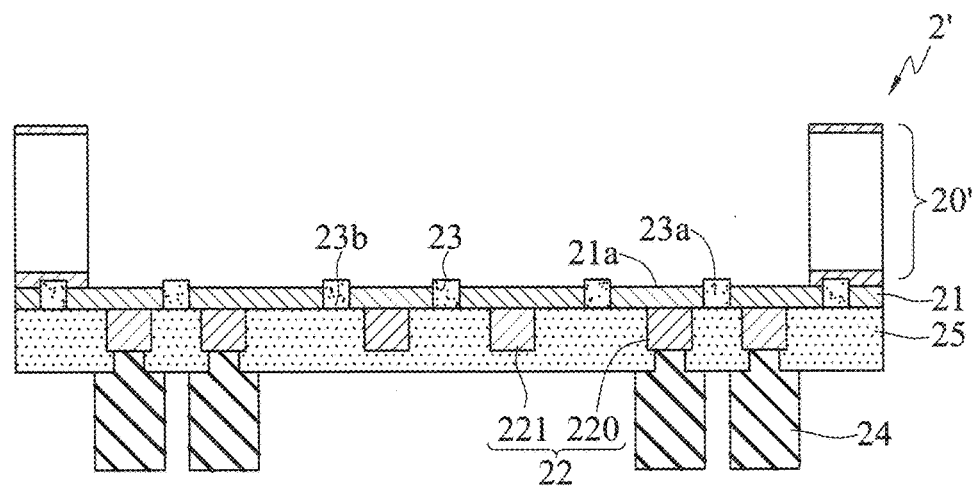

As illustrated in FIG. 2F, the carrier 20 is completely removed, and the upper surface 21a of the wiring layer 21 is exposed from the first surface 23a of the insulating layer 23.

In an embodiment, the metal material 20a is removed by an etching process, and an upper surface 21a of the wiring layer 21 is etched, such that the upper surface 21a of the wiring layer 21 is slightly lower than the first surface 23a of the insulating layer 23.

As illustrated in FIG. 2F', a portion of the carrier 20 is removed by a patterning process, such that a remaining portion of the carrier is used as the supporting structure 20', and the surface 21a of the wiring layer 21 is exposed from the first surface 23a of the insulating layer 23.

Therefore, in the method of the first embodiment the interposer substrate 2, 2' is a coreless layer design, such that in the process, the fabrication process of via may be eliminated. Accordingly, the cost of the overall process in this embodiment is low and the process is simple.

Further, compared with the prior interposer substrate, the interposer substrate 2, 2' without the limitation of the prior plate not only is readily produced but also has no problem of plate damages. In addition, circuits with more fine line width/line space (L/S) can be produced so as to increase the density of layout.

Further, in this embodiment, if the carrier 20 has metal material, the metal material 20a of the copper foil substrate is used as the conducting layer, such that the external connection pillars 24 may be produced in the electroplating way without forming an additional conducting layer. Accordingly, the remaining conducting layer is prevented from affecting the conductivity of the external connection pillars 24, and the overall conductivity of the interposer substrate 2, 2' may be increased.

Additionally, the major layout of the interposer substrate 2, 2' is the wiring build-up layer structure 22.

FIGS. 3A-3D are schematic sectional views illustrating a method for fabricating an interposer substrate 3 according to a second embodiment of the present invention. The second embodiment differs from the first embodiment in that in the second embodiment the process of using other material as the insulating protection layer to replace the solder mask is employed.

Figure 3A:
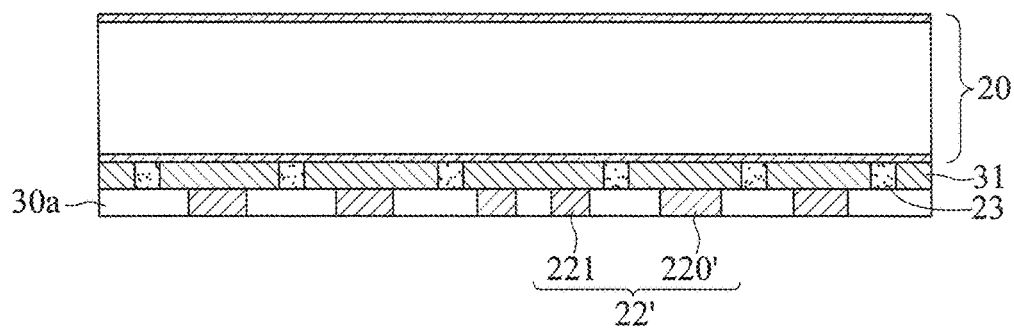
FIGS. 3A-3E are schematic sectional views illustrating a method for fabricating an interposer substrate according to a second embodiment of the present invention, wherein FIG. 3C' is another aspect of FIG. 3C, and FIG. 3E' is another aspect of FIG. 3E.

As illustrated in FIG. 3A, it is the subsequent process of FIG. 2C. A plurality of conductive pillars 220' are disposed on a first copper pillar layer 31 (regarded as the wiring layer) and the insulating layer 23 through a resistive layer 30a, such that the wiring build-up layer structure 22' in the resistive layer 30a is electrically connected to the first copper pillar layer 31

In an embodiment, the wiring build-up layer structure 22' comprises a plurality of conducting traces 221 and a plurality of conductive pillars 220'.

Figure 3B:
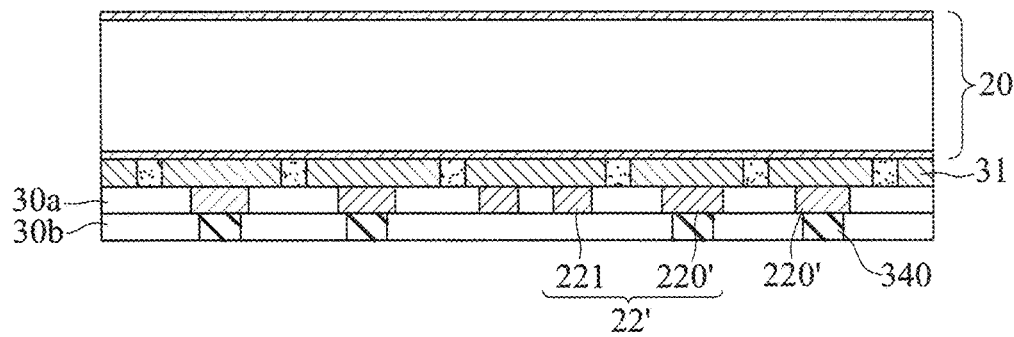

As illustrated in FIG. 3B, a second copper pillar layer 340 (regarded as the connection portion) is formed on the conductive pillars 220' through another resistive layer 30b, such that the conductive pillars 220' are disposed between the first copper pillar layer 31 and the second copper pillar layer 340.

Figure 3C:
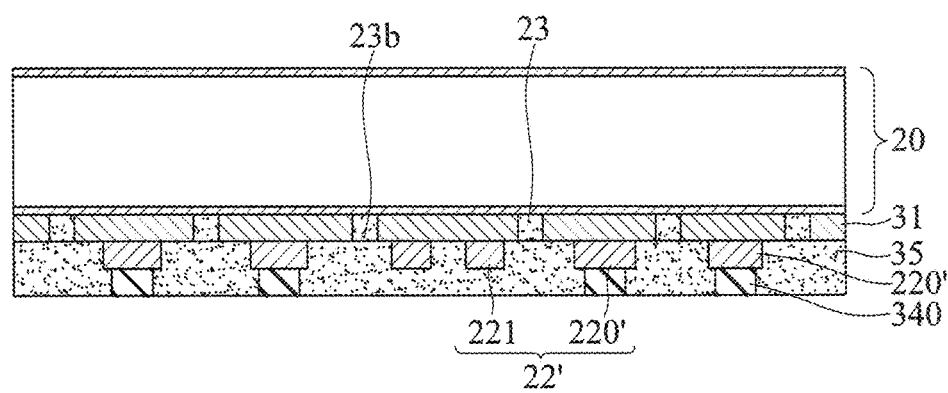
Figure 3C:
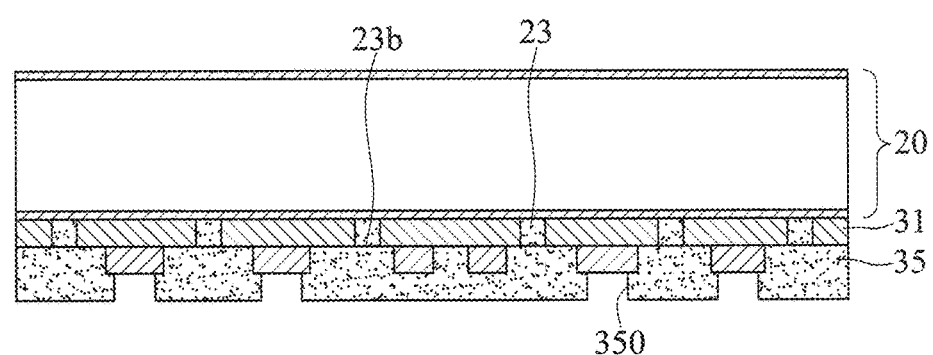

As illustrated in FIG. 3C, after the resistive layers 30a and 30b are removed, an insulating protection layer 35 is formed on a second surface 23b of the insulating layer 23, such that the insulating protection layer 35 encapsulates the second copper pillar layer 340 and the wiring build-up layer structure 22', and the second copper pillar layer 340 is exposed from the insulating protection layer 35.

In an embodiment, the insulating layer 23 is made of a molding compound, an epoxy, or a dielectric material.

Figure 3D:
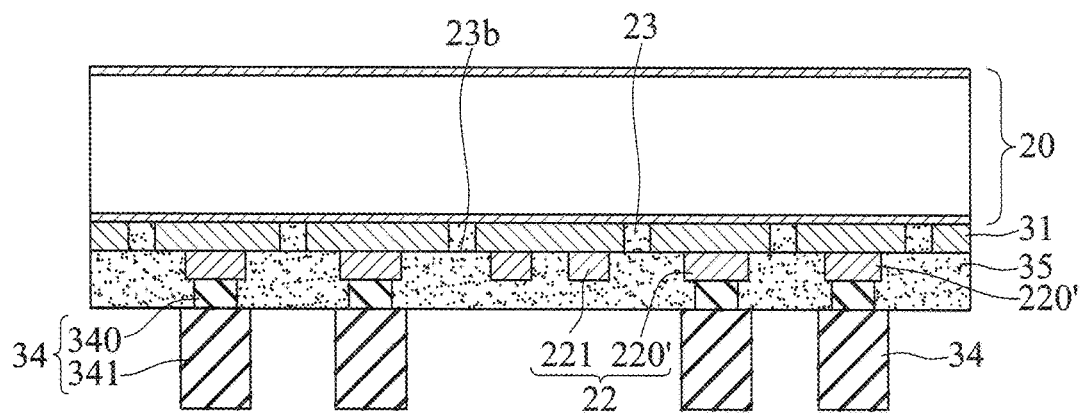

As illustrated in FIG. 3D, a plurality of main portions 341 are formed on the second copper pillar layer 340, such that the main portions 341 and the second copper pillar layer 340 are used as the external connection pillars 34, and the external connection pillar 34 are electrically connected to the wiring build-up layer structure 22'

In an embodiment, the external connection pillars 34 are fabricated through two processes.

Further, in another embodiment, the external connection pillars 34 can be fabricated in one process. As illustrated in FIG. 3C', the resistive layer 30a is removed; then the wiring build-up layer structure 22' is formed; then the photographic insulating protection layer 35 is formed so as to encapsulate the wiring build-up layer structure 22'; then a plurality of openings 350 are formed through exposure developing method; and at last a second copper pillar layer 340 and the main portion 341 are integrally formed in the opening 350 and on the conductive pillars 220'.

Further, in another embodiment, the wiring build-up layer structure and the insulating protection layer 35 can be fabricated according to requirements.

Figure 3E:
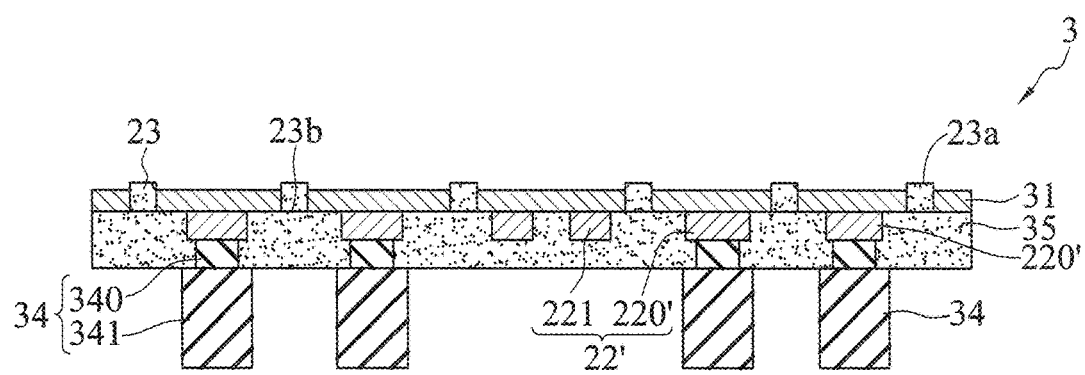
Figure 3E:
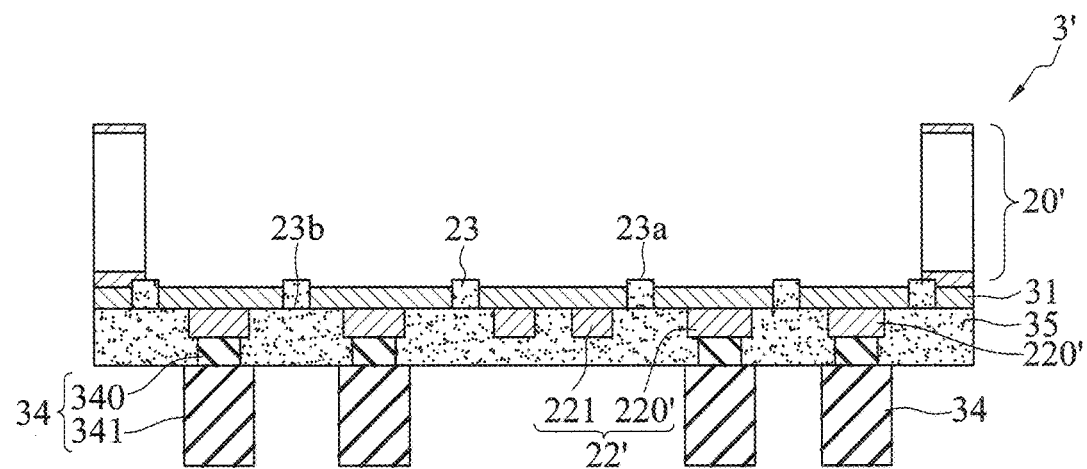

As illustrated in FIG. 3E, the carrier 20 is completely removed, such that the first copper pillar layer 31 is exposed from the first surface 23a of the insulating layer 23.

As illustrated in FIG. 3E', a portion of the carrier 20 is removed by a patterning process, such that the remaining portion of the carrier is used as the supporting structure 20', and the first copper pillar layer 31 is exposed from the first surface 23a of the insulating layer 23.

Therefore, in the method for fabricating the second embodiment, the solder mask is replaced by molding compound, epoxy or dielectric material as the insulating protection layer so as to decrease the cost.

The present invention further provides an interposer substrate 2, 2', 3, 3', having a insulating layer 23, a wiring layer 21 (or a first copper pillar layer 31), a wiring build-up layer structure 22, 22', an insulating protection layer 25, and a plurality of external connection pillars 24, 34.

The insulating layer 23 has a first surface 23a and a second surface 23b opposing the first surface 23a, and the insulating layer 23 is made of a molding compound, an epoxy, or a dielectric material.

The wiring layer 21 (or the first copper pillar layer 31) is embedded in the first surface 23a of the insulating layer 23 and in communication with the second surface 23b of the insulating layer 23, the upper surface 21a of the wiring layer 21 is slightly lower than the first surface 23a of the insulating layer 23, and the lower surface 21b of the wiring layer 21 is flush with the second surface 23b of the insulating layer 23.

The wiring build-up layer structure 22, 22' is formed on and electrically connected to the wiring layer 21 (or the first copper pillar layer 31).

The external connection pillars 24, 34 are formed on and electrically connected to the wiring build-up layer structure 22, 22'.

In an embodiment, the interposer substrate further comprises an insulating protection layer 25, 35 formed on the second surface 23b of the insulating layer 23 and the wiring layer 21 (or the first copper pillar layer 31) to encapsulate the wiring build-up layer structure 22, 22' and expose the wiring build-up layer structure 22, 22', for the external connection pillars 24, 34 to be disposed thereon.

In an embodiment, the wiring build-up layer structure 22 comprises a plurality of conductive pads 220 and a plurality of conducting traces 221, such that the external connection pillars 24 are disposed on the conductive pads 220.

In an embodiment, the wiring build-up layer structure 22' comprises a plurality of conducting traces 221 and a plurality of conductive pillars 220', such that the external connection pillars 34 are disposed on the conductive pillars 220'.

In an embodiment, the external connection pillars 24, 34 comprise a connection portion 240 (or the second copper pillar layer 340) connected to the wiring build-up layer structure 22, 22', and a main portion 241, 341 disposed on the connection portion 240 (or the second copper pillar layer 340).

In an embodiment, the external connection pillars 24 are integrally formed.

In an embodiment, the interposer substrate 2', 3' further comprises a supporting structure 20' disposed on the first surface 23a of the insulating layer 23.

In conclusion, the interposer substrate and the method for fabricating the interposer substrate according to the present invention are applied on products of the package on package (PoP) with fine spacing and high pin number, and when products tend to be light, thin short, small and faster and to have stronger function and larger storage, the interposer substrate in this invention is more required.

Further, the interposer substrate of this invention may be connected to a logic packaging member (logic IC) or a memory packaging member (memory IC) through the external connection pillar, and may be connected to the logic packaging member (logic IC) or the memory packaging member (memory IC) through the wiring layer.

The above-described embodiments exemplarily explain the principles and effects of this invention without intending to limit this invention. Persons skilled in the art can modify the above-described embodiments without departing from the spirit and scope of this invention. Therefore, the protection scope of this invention shall be listed as follows.

What is claimed is:

1. A package on package, comprising:
   an interposer substrate including:

an insulating layer having a first surface and a second surface opposing the first surface and made of a molding compound, a primer or epoxy;

a wiring layer formed on the first surface of the insulating layer and being in communication with the second surface of the insulating layer;

a wiring build-up layer structure formed on the second surface of the insulating layer and electrically connected to the wiring layer, wherein the wiring build-up layer structure comprises a plurality of conductive pillars;

an insulating protection layer formed on the second surface of the insulating layer and the wiring layer and encapsulating the wiring build-up layer structure, wherein the wiring build-up layer structure is exposed from the insulating protection layer; and a plurality of external connection pillars disposed on, protruding from and electrically connected to the wiring build-up layer structure, wherein each of the external connection pillars comprises a connection portion connected to and being in direct contact with each of the conductive pillars and a main portion disposed on the connection portion, protruding from the insulating protection layer and having a circumference surface exposed from the insulating protection layer;

at least one integrated circuit (IC) or IC packaging member stacked on the wiring layer of the interposer substrate; and an IC packaging member stacked below and electrically connected to the external connection pillars of the interposer substrate, wherein the IC packaging member is in an elevated space of the external connection pillars.

2. The package on package of claim 1, wherein the wiring layer has a surface lower than the first surface of the insulating layer.

3. The package on package of claim 1, wherein the wiring layer has a surface flush with the second surface of the insulating layer.

4. The package on package of claim 1, wherein the wiring build-up layer structure comprises a plurality of conducting traces.

5. The package on package of claim 1, wherein the external connection pillars are integrally made.

6. The package on package of claim 1, further comprising a supporting structure disposed on the first surface of the insulating layer.

* * * * *